US009081157B2

(12) United States Patent
Shin

(10) Patent No.: US 9,081,157 B2
(45) Date of Patent: Jul. 14, 2015

(54) APPARATUS FOR WAVELENGTH-DIVISION MULTIPLEXING AND DEMULTIPLEXING

(75) Inventor: Hyunee Shin, Daejeon (KR)

(73) Assignee: Optics Co., Ltd., Daejeon (KR)

( * ) Notice: Subject to any disclaimer, the term of this patent is extended or adjusted under 35 U.S.C. 154(b) by 225 days.

(21) Appl. No.: 13/821,649

(22) PCT Filed: Jul. 11, 2011

(86) PCT No.: PCT/KR2011/005050
§ 371 (c)(1),
(2), (4) Date: Mar. 8, 2013

(87) PCT Pub. No.: WO2012/039542
PCT Pub. Date: Mar. 29, 2012

(65) Prior Publication Data
US 2013/0168537 A1    Jul. 4, 2013

(30) Foreign Application Priority Data

Sep. 20, 2010   (KR) .......................... 10-2010-0092276

(51) Int. Cl.
*G02B 6/36*       (2006.01)
*G02B 6/42*       (2006.01)
(Continued)

(52) U.S. Cl.
CPC ............ *G02B 6/4267* (2013.01); *G02B 3/0037* (2013.01); *G02B 6/4206* (2013.01); *G02B 6/4215* (2013.01); *G02B 6/4292* (2013.01); *G02B 6/43* (2013.01); *H01L 27/14* (2013.01); *H01L 31/02327* (2013.01); *G02B 6/29367* (2013.01); *G02B 6/4214* (2013.01)

(58) Field of Classification Search
CPC ...... G02B 6/4204; G02B 6/42; G02B 6/4206; G02B 6/4292
USPC .................. 385/88–94, 79; 359/793; 250/216
See application file for complete search history.

(56) References Cited

U.S. PATENT DOCUMENTS 6,219,476 B1 *   4/2001   Kususawa et al. .............. 385/33
6,550,983 B1 *   4/2003   Gilliland et al. ................ 385/93
(Continued)

FOREIGN PATENT DOCUMENTS

JP       2006-284856 A    10/2006
JP       2007-163947 A     6/2007
(Continued)

OTHER PUBLICATIONS

International Search Report and Written Opinion (both in Korean with English translation) for PCT/KR2011/005050, mailed Jan. 13, 2012; ISA/KR.

*Primary Examiner* — Ellen Kim
(74) *Attorney, Agent, or Firm* — Harness, Dickey & Pierce, PLC

(57) ABSTRACT

The present invention relates to an apparatus for wavelength-division multiplexing and demultiplexing, to an optical communication module, and to an optical device. The apparatus for wavelength-division multiplexing and demultiplexing comprises: a first lens block having a lens array at one side thereof; a second lens block having a lens surface corresponding to the lens array and combined with the other side of the first lens block; a receptacle having an optical fiber ferrule fixed at the center thereof and stacked on the second lens block; and a base combined with one side of the first lens block, wherein the first block is stacked on the base.

20 Claims, 7 Drawing Sheets

(51) Int. Cl.
  *G02B 3/00* (2006.01)
  *G02B 6/43* (2006.01)
  *H01L 27/14* (2006.01)
  *H01L 31/0232* (2014.01)
  *G02B 6/293* (2006.01)

(56) References Cited

U.S. PATENT DOCUMENTS

| | | | |
|---|---|---|---|
| 6,739,766 B2 * | 5/2004 | Xu et al. | 385/93 |
| 6,872,011 B2 * | 3/2005 | Ikeda et al. | 385/92 |
| 6,931,181 B2 * | 8/2005 | Jewell et al. | 385/49 |
| 7,348,203 B2 * | 3/2008 | Kaushal et al. | 438/64 |
| 7,463,830 B2 * | 12/2008 | Whitehead et al. | 398/138 |
| 7,572,068 B2 * | 8/2009 | Nagano et al. | 385/93 |
| 8,113,725 B2 * | 2/2012 | Tagami | 385/92 |
| 8,165,432 B2 * | 4/2012 | Ohta et al. | 385/15 |
| 8,540,437 B2 * | 9/2013 | Lee et al. | 385/93 |
| 8,714,838 B2 * | 5/2014 | Son et al. | 385/89 |
| 2001/0026663 A1 * | 10/2001 | Kim et al. | 385/76 |
| 2003/0053167 A1 * | 3/2003 | Xu | 359/124 |
| 2004/0218875 A1 * | 11/2004 | Lemoff et al. | 385/89 |
| 2005/0069013 A1 * | 3/2005 | Bhandarkar et al. | 372/102 |
| 2005/0175347 A1 * | 8/2005 | Ray et al. | 398/88 |
| 2005/0185900 A1 * | 8/2005 | Farr | 385/93 |
| 2008/0106874 A1 * | 5/2008 | Okuda | 361/749 |
| 2009/0180741 A1 * | 7/2009 | Sakuramoto et al. | 385/92 |
| 2011/0110666 A1 * | 5/2011 | Shin et al. | 398/88 |

FOREIGN PATENT DOCUMENTS

| | | |
|---|---|---|
| KR | 10-2002-0064699 A | 8/2002 |
| KR | 10-2010-0008761 A | 1/2010 |
| KR | 20-2010-0004205 U | 4/2010 |

* cited by examiner

APPARATUS FOR WAVELENGTH-DIVISION MULTIPLEXING AND DEMULTIPLEXING

CROSS-REFERENCE TO RELATED APPLICATIONS

This application is a 371 U.S. National Stage of International Application No. PCT/KR2011/005050, filed Jul. 11, 2011, and claims priority to Korean Patent Application 10-2010-0092276, filed Sep. 20, 2010, the disclosures of which are herein incorporated by reference in their entirety.

TECHNICAL FIELD

The present invention relates to an optical communication module, and more particularly, to an apparatus for wavelength-division multiplexing and demultiplexing that is capable of transmitting or receiving optical signals of different wavelengths through a single optical fiber.

BACKGROUND ART

A wavelength-division multiplexing (WDM) is used to transmit optical signals of different wavelengths through a single optical fiber.

DETAILED DESCRIPTION OF THE INVENTION

Technical Problem

The present invention provides an apparatus for wavelength-division multiplexing and demultiplexing that is easily aligned and is resistant to thermal expansion.

The present invention provides an optical communication module that is easily aligned and is resistant to thermal expansion.

The present invention provides an optical device that is easily aligned and is resistant to thermal expansion.

TECHNICAL SOLUTION

According to an aspect of the present invention, there is provided an apparatus for wavelength division multiplexing and demultiplexing, which includes a first lens block including a lens array at one side of the first lens block, a second lens block including a lens surface corresponding to the lens array and combined with another side of the first lens block, a receptacle having an optical fiber ferrule fixed at a center thereof and stacked on the second lens block, and a base combined with the one side of the first lens block, in which the first lens block is stacked on the base.

According to an aspect of the present invention, there is provided an optical apparatus including a reinforcement plate formed of a metal material, a plurality of photoelectric devices arranged on the reinforcement plate, and a multiplexing and demultiplexing unit arranged on the plurality of photoelectric devices, in which the multiplexing and demultiplexing unit directly or indirectly contacts the reinforcement plate and is formed of a high strength plastic including glass.

According to an aspect of the present invention, there is provided an optical communication module including a reinforcement plate formed of a metal material, a flexible printed circuit board stacked on the reinforcement plate, a substrate provided on the flexible printed circuit board, a photoelectric device provided on the substrate, and an optical portion arranged around the photoelectric device and provided on the flexible printed circuit board, in which a material of a portion where the flexible printed circuit board and the optical is portion contact each other is high strength plastic including glass.

ADVANTAGEOUS EFFECTS

The apparatus for wavelength-division multiplexing and demultiplexing according to the present invention has a structure in which the first lens block and the second lens block are fixedly attached to the base. Thus, lenses may be easily aligned in the apparatus for wavelength-division multiplexing and demultiplexing. Also, the reinforcement plate of the apparatus for wavelength-division multiplexing and demultiplexing is a metal material, and the base is a plastic material including glass. Accordingly, the reinforcement plate and the base have an almost identical thermal expansion coefficient, and thus an additional thermal expansion restriction member is not needed.

Figure 1:
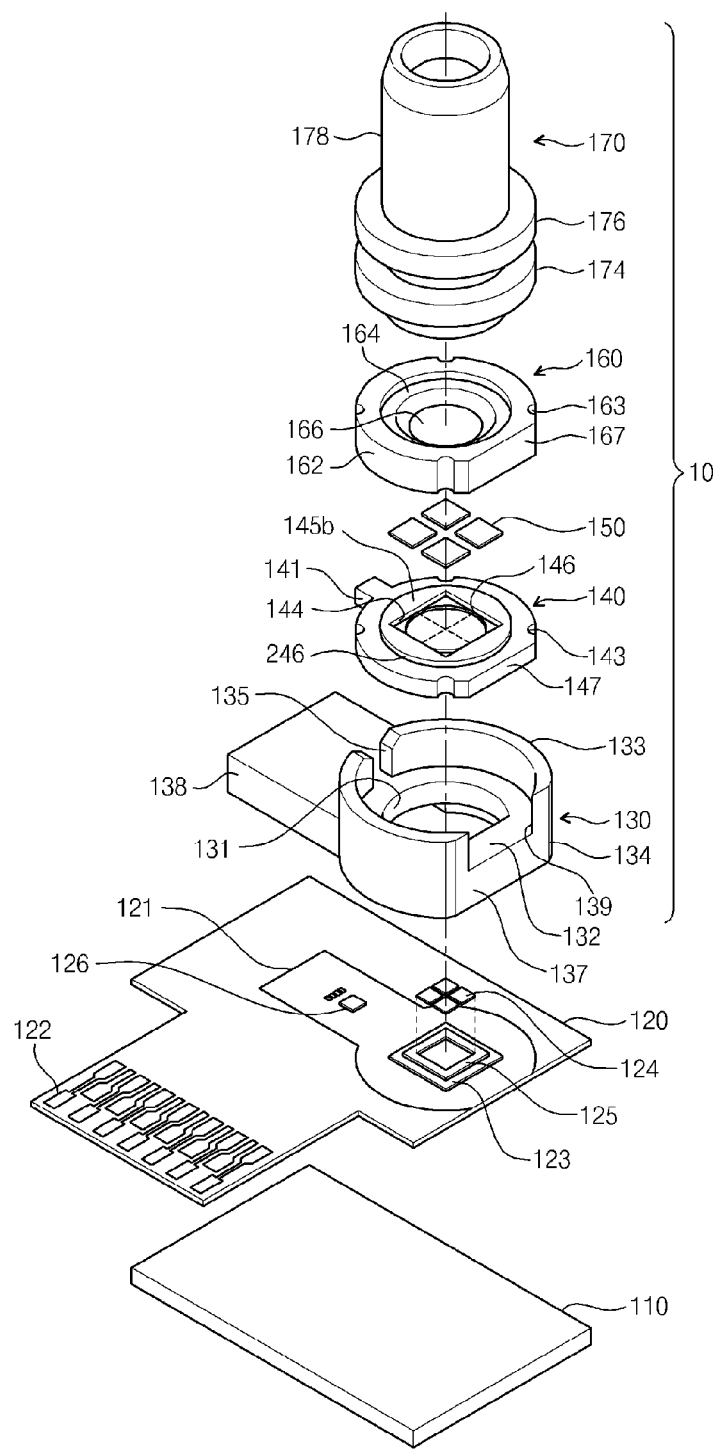
FIG. 1 is a perspective view illustrating an apparatus for wavelength-division multiplexing and demultiplexing according to an embodiment of the present invention.

10: apparatus for wavelength-division multiplexing and demultiplexing
149: lens array
150: thin film filters
140: first lens block
160: second lens block
170: receptacle
180: optical fiber ferrule
124: photoelectric devices
120: flexible substrate
110: reinforcement plate

BEST MODE

A typical wavelength division multiplexer (WDM) has problems in temperature dependency and alignment. A WDM according to an embodiment of the present invention includes a metal reinforcement plate and a plastic base to prevent a failure of optical alignment according to a temperature. The optical alignment of WDM may fail due to a difference in a thermal expansion coefficient. However, the reinforcement plate according to the present invention is formed of a metal material, and the reinforcement plate is combined with the WDM including a plastic material by using an adhesive. The reinforcement plate of a metal material has a thermal expansion coefficient that is almost the same as that of the base of the WDM. Thus, the failure of optical alignment of the WDM due to thermal expansion may be prevented.

Also, in the WDM according to the present embodiment, a problem of alignment between optical parts is solved by means of insertion coupling and/or is bonding using an adhesive. Accordingly, a WDM having a simple structure at a reasonable cost may be provided.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 2A:
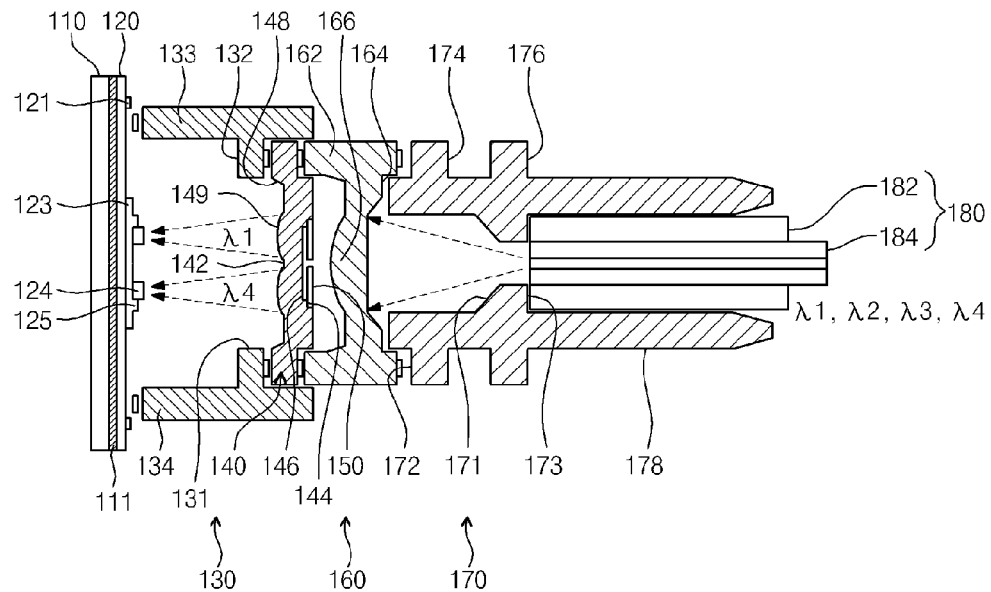
FIG. 2A is a cross-sectional view of the apparatus for wavelength-division multiplexing and demultiplexing of FIG. 1.
Figure 2B:
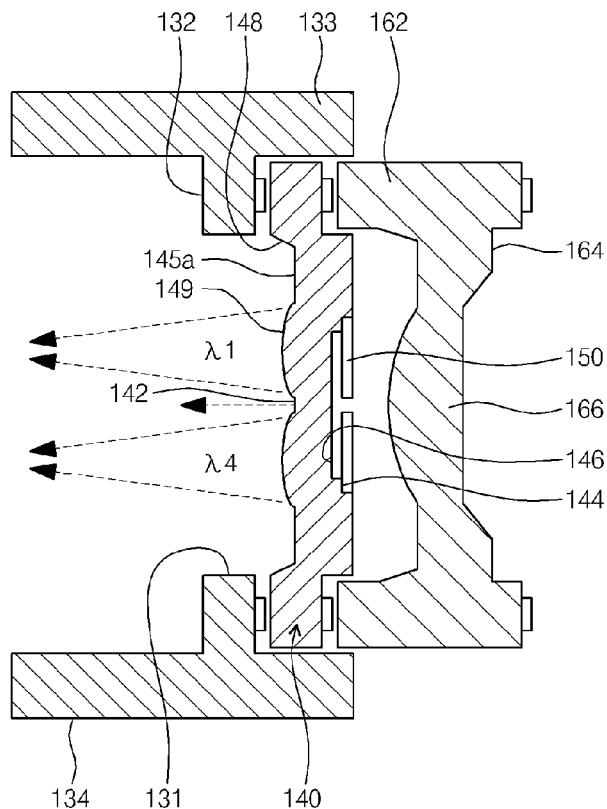
FIG. 2B is an enlarged view of a portion of FIG. 2A.
Figure 3:
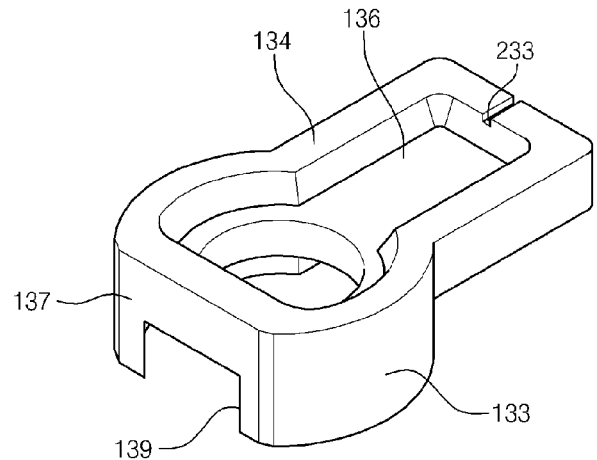
FIGS. 3, 4, and 5 are perspective views, respectively, illustrating a base, a first lens block, and a second lens block of FIG. 1.
Figure 4:
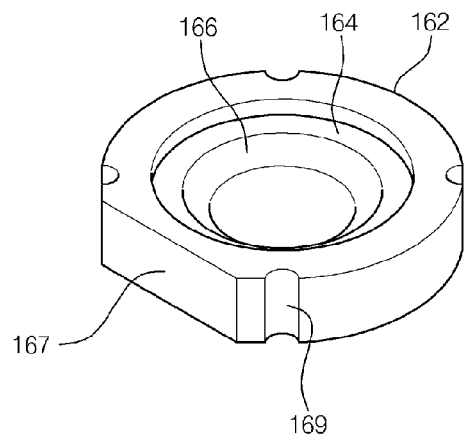
Figure 5:
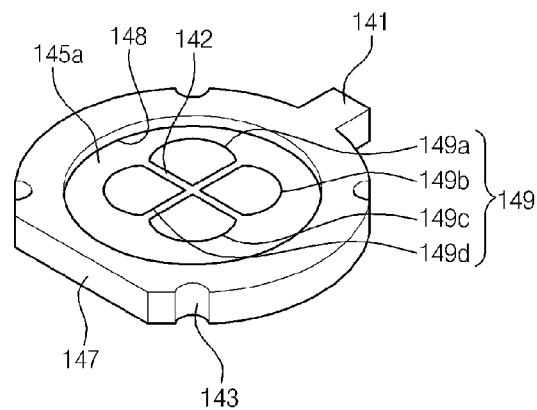

FIG. 1 is a perspective view illustrating an apparatus 10 for wavelength-division multiplexing and demultiplexing according to an embodiment of the present invention. FIG. 2A is a cross-sectional view of the apparatus 10 for wavelength-division multiplexing and demultiplexing of FIG. 1, and FIG. 2B is an enlarged view of a portion of FIG. 2A. FIGS. 3, 4, and 5 are perspective views, respectively, illustrating a base 130, a first lens block 140, and a second lens block 160 of FIG. 1.

Referring to FIGS. 1 to 5, the apparatus 10 for wavelength-division multiplexing and demultiplexing includes the first lens block 140 having a lens array 149 at one side thereof, the second lens block 160 having a lens surface corresponding to the lens array 149 and combined with the other side of the first lens block 140, a receptacle 170 having an optical fiber ferrule 180 fixed at the center thereof and stacked on the second lens block 160, and the base 130 combined with one side of the first lens block 140. The first lens block 140 is stacked on the base 130. The base 130 and the first lens block 140 may be insertion combined with each other.

The first lens block 130 may have a shape similar to a disc. The lens array 149 may be arranged on a first surface 145a of the first lens block 140. A hollow 148 to protect a lens having a predetermined depth may be arranged at one side of the first lens block 140. The hollow 148 may have a cylindrical shape with respect to a center axis of the first lens block 140. A bottom surface of the hollow 148 forms the first surface 145a and the lens array 149 may be formed on the first surface 145a. The first lens block 140 may be formed in is one body and of a transparent plastic or acryl material.

The lens array 149 may be symmetrically arranged around the center axis of the first lens block 140. For example, the lens array 149 may include first to fourth auxiliary lenses 149a-149d. Each of the first to fourth auxiliary lenses 149a-149d may have a reference point. Each of the first to fourth auxiliary lenses 149a-149d may collimate a light ray starting from a focus thereof to a parallel light. Each of the first to fourth auxiliary lenses 149a-149d may focus a parallel light incident upon the first to fourth auxiliary lenses 149a-149d to a focus thereof.

According to a modified embodiment of the present invention, the lens array 149 may be modified into two (2) auxiliary lenses, three (3) auxiliary lenses, four (4) auxiliary lenses, or six (6) auxiliary lenses. The number of auxiliary lenses may be dependent upon the number of channels of an optical signal.

A portion where the first to fourth auxiliary lenses 149a-149d are adjacent to each other may form a separation region 142 that has a different radius of curvatures from those of the first to fourth auxiliary lenses 149a-149d or is opaque to block transmission of an optical signal. The light rays passing through the separation region 142 may not be concentrated on each of the focuses of the first to fourth auxiliary lenses 149a-149d. The separation region 142 may be diversely modified according to the shape of the lens array 149. Also, the separation region 142 may be variously modified as long as a light ray passing through the separation region 142 is not concentrated on the focus of the lens array 149. For example, the separation region 142 may be modified to be formed on the other side of the first lens block 140.

When the external shape of the lens array 149 is described, the first to fourth auxiliary lenses 149a-149d are symmetrically arranged with respect to the center axis of the first lens block 140 and the separation region 142 may be formed in the shape of a straight line having a certain width in an area where the first to fourth auxiliary lenses 149a-149d are overlapped. An area between the thin film filters 150 for selecting wavelengths is an empty space through incident optical signals of all wavelengths pass. To prevent signals of various wavelengths from being incident upon a photodiode (PD), the separation region is 142 is formed to be larger than the empty space between the thin film filters 150.

The separation region 142 is formed to be opaque to prevent transmission of an optical signal or to have a different radius of curvature from those of the first to fourth auxiliary lenses 149a-149d to prevent the optical signal from being incident upon the photodiode (PD). When the separation region 142 does not exist, optical signals incident upon a boundary between the first to fourth auxiliary lenses 149a-149d may be concentrated on a plurality of focuses. Thus, for each auxiliary lens to provide only one optical signal to a focus, the separation region 142 may be arranged in an area where the first to fourth auxiliary lenses 149a-149d contact one another. The separation region 142 may match an area that spatially separates the first to fourth auxiliary lenses 149a-149d. A plane where the separation region 142 is arranged may not match with the first surface 145a. The separation region 142 may have a different height on the first surface 145a. A light ray passing through the separation region 142 may be variously modified unless the light ray is concentrated on the focus of the lens array 149.

The first to fourth auxiliary lenses 149a-149d may be spherical lenses having a certain radius of curvature with respect to each reference point, or aspherical lenses. The first to fourth auxiliary lenses 149a-149d may have the same focal length. When a difference in the wavelengths of optical signals is large, the focal length may be adjusted to fit to the wavelength. The surfaces of the first to fourth auxiliary lenses 149a-149d may be non-reflection coated.

The first lens block 140 may have a first concave 144 and a second concave 146 arranged inside the first concave 144, both concaves being formed in a second surface 145b. The thin film filters 150 may be arranged in the first concave 144. The first concave may have a rectangular shape formed with respect to the center axis of the first lens block 140. A center axis of the second concave 146 may match the center axis of the first concave 144. The depth of the first concave 144 may be greater than the thickness of each of the thin film filters 150. In other words, a vertical distance from a bottom surface of the first concave 144 to the second surface 145b may be greater than the thickness of each of the thin film filters 150. The second concave 146 is is circular, and the depth of the second concave 146 may be several to tens of micrometers or more. The depth of the second concave 146 may be sufficiently large such that a Fabry-Perot interferometer effect between the thin film filters 150 and the bottom surface of the second concave 146 can be diminished.

The length of one side of the first concave 144 may be greater than or equal to the diameter of the second concave 146. The thin film filters 150 may be provided on the bottom surface of the first concave 144 to fit to corner portions of the first concave 144. The thin film filters 150 may be bonded to the corner portions of the first concave 144 by using an adhesive. The diameter of the second concave 146 may be greater than the diameter of a lens portion 166 of the second lens block 160.

One surface of each of the thin film filters 150 may be coated to form a wavelength selection filter. The other surface of each of the thin film filters 150 may be non-reflection coated. The thin film filters 150 may be band pass filters or edge filters. For a band pass filter, a full width half maximum (FWHM) may be about 4 nm-30 nm. The thin film filters 150 may include dielectric thin films stacked on a glass substrate or a plastic substrate. The central wavelengths of the thin film filters 150 may be different from one another. For example, in case of four (4) channels, the central wavelengths of the thin film filters 150 may be 900 nm, 930 nm, 960 nm, and 990 nm. The thin film filters 150 each may have a rectangular shape. The thin film filters 150 are inserted in the first concave 144 and fixed thereto by using an adhesive.

The first lens block 140 may have a protruding portion 141. The protruding portion 141 may extend in a first direction from a plane where the first lens block 140 is arranged. The protruding portion 141 may be inserted in a groove 135 of the base 130 to be aligned thereto. The first lens block 140 may be formed in one body and formed of a transparent material. In detail, the first lens block 140 may be transparent plastic or acryl-based resin.

The first lens block 140 may include a first alignment portion 246. The first alignment portion 246 may be formed as the second surface 145b collapses. In detail, the thickness of the first alignment portion 246 may be reduced as an is edge portion of the first lens block 140 collapses with respect to the center axis of the first lens block 140. The second lens block 160 may be inserted around the first alignment portion 246 so that the two may be combined with each other.

The first lens block 140 may include a first lateral surface 147. The first lateral surface 147 may be formed at the opposite side to the protruding portion 141. The first lateral surface 147 may be formed as one side of the first lens block 140 cut along a straight line. The first lateral surface 147 may be used to mount two wavelength-division multiplexing and demultiplexing apparatuses to be close each other. In other words, the two wavelength-division multiplexing and demultiplexing apparatuses may be provided such that the first lateral surfaces 147 of the two wavelength-division multiplexing and demultiplexing apparatuses can face each other.

The first lens block 140 may include a first auxiliary alignment portion 143. The first auxiliary alignment portion 143 may be provided by symmetrically forming grooves in an outer surface of the first lens block 140. The groove may have a cylindrical shape, and the cylindrical shape may be aligned in a direction along the center axis of the first lens block 140.

The second lens block 160 may include a second lens body portion 162, a connection portion 164, and a lens portion 166. The second lens body portion 162 is arranged around the lens portion 166. The second lens body portion 162 may be of a cylindrical shell type. The connection portion 164 has a washer shape, is inserted in the second lens body portion 162, and connects the lens body portion 162 and the lens portion 166. The second lens body portion 162 may support the lens portion 166 and prevent damage of the lens portion 166 due to friction. The second lens block 160 may be manufactured in one body. The second lens block 160 may be formed of a transparent plastic or acryl resin material. The second lens body portion 162 may be insertion combined with the first alignment portion 246. Also, the second lens body portion 162 may be inserted in the first alignment portion 246 and fixed thereto by using an adhesive.

One surface of the lens portion 166 may be a spherical or aspherical is surface, whereas the other surface thereof may be a flat surface. Alternatively, the opposite surfaces of the lens body 166 may both be spherical or aspherical surfaces. Accordingly, the lens portion 166 may provide a parallel light to the lens array 149 or provide a parallel light provided by the lens array 149 to the optical fiber ferrule 180 by concentrating the parallel light of the lens array 149. The outer diameter of the lens portion 166 may be less than or equal to the outer diameter of the second concave 146 of the first lens block 140. The second lens block 160 may be diversely modified as long as the second lens block 160 converts a light ray starting from a focus to a parallel light.

The inner diameter of the second lens body portion 162 may be the same as the inner diameter of the first alignment portion 246, within a clearance range. Also, the outer diameter of the second lens body portion 162 may be the same as the outer diameter of the first lens block 140. Accordingly, the first and second lens blocks 140 and 160 may be inserted in the base 130.

The second lens block 160 may include a second lateral surface 167. The second lateral surface 167 may be formed by cutting one side of the second lens block 160 along a straight line. The second lateral surface 167 may be used to mount a plurality of wavelength-division multiplexing and demultiplexing apparatuses. In other words, two wavelength-division multiplexing and demultiplexing apparatuses may be provided such that the second lateral surfaces 167 of the two wavelength-division multiplexing and demultiplexing apparatuses can face each other.

The second lens block 160 may include a second auxiliary alignment portion 163. The second auxiliary alignment portion 163 may be provided by symmetrically forming grooves in an outer surface of the second lens block 160. The groove may have a cylindrical shape and the cylindrical shape may be aligned in a direction along the center axis of the second lens block 160.

The receptacle 170 may have a cylindrical shape. The optical fiber ferrule 180 may be inserted in the receptacle 170 on a center axis of the receptacle 170. One end of the optical fiber ferrule 180 may be arranged within a focal length of the second lens block 160. One end of the receptacle 170 may include a hole 171 having a diameter that increases along one direction is approaching to one end of the receptacle 170. The hole 171 may provide a light procession space in which a light ray starting from the optical fiber ferrule 180 proceeds toward the lens portion 166. Also, the hole 171 may provide a light procession space in which the light ray starting from the lens portion 166 proceeds toward the optical fiber ferrule 180.

The other end of the receptacle 170 may include a hole 173 having a certain diameter. The optical fiber ferrule 180 may be inserted at the other end side of the receptacle 170. One end of the receptacle 170 may be insertion combined with the second body portion 162 by being inserted therein. Also, the receptacle 170 and the second lens block 160 may be fixedly combined with each other by using an adhesive. The outer shape of the receptacle 170 may be modified into a variety of shapes so that an external mounting device may fix the receptacle 170.

For example, the receptacle 170 may include a first washer portion 174 and a second washer portion 176 arranged on a lateral surface in a cylindrical body. Accordingly, a fixing portion (not shown) is inserted between the first washer portion 174 and the second washer portion 176 to fix the receptacle 170.

The optical fiber ferrule 180 may include an optical fiber 184 arranged at a center thereof and a connection portion 182 for supporting the optical fiber 184. The optical fiber 184 may be a single mode optical fiber or a multi-mode optical fiber.

The base 130 includes a center plate 132 having a through hole 131 at a center thereof, a first guard portion 133 having a cylindrical shape, a diameter larger than that of the through hole 131, and arranged at one side of the center plate 132, and a second guard portion 134 having a cylindrical shape, a diameter larger than that of the through hole 131, and arranged at the other side of the center plate 132. The first lens block 140 and the second lens block 160 are sequentially stacked and inserted in the first guard portion 133.

The base 130 may be manufactured in one body. The base 130 may be formed of a high strength plastic material including glass. In particular, the base 130 may be polycarbonate or 30% glass-reinforced grade Ultem. A is thermal expansion coefficient of the base 130 may be almost the same as that of the reinforcement plate 110. Accordingly, a unit for restricting deformation due to a difference in thermal expansion between the base 130 and the reinforcement plate 110 may be omitted. The reinforcement plate 110 may be formed of a stainless steel material. Accordingly, the reinforcement plate 110 has superior thermal conductivity and strength so as to provide stability and reliability.

The through hole 131 of the center plate 132 may provide a space in which a light ray proceeds. The diameter of the through hole 131 may be greater than or equal to an outer diameter of an area defining the outermost range of the lens array 149. The first lens block 140 is provided on the center plate 132. The outer diameter of the first lens block 140 may be substantially the same as the inner diameter of the first guard portion 133.

The first guard portion 133 may have a cylindrical shape. The height of the first guard portion 133 may be greater than or equal to the thickness of the first lens block 140. Accordingly, the first lens block 140 and the second lens block 160 may be sequentially stacked inside the first guard portion 133.

The first guard portion 133 may include a concave portion 135 at one side thereof and an auxiliary groove 139 at the other side thereof. The concave portion 135 may be formed as a portion of the first guard portion 133 collapses. A lower surface of the concave portion 135 may match an upper surface of the center plate 132. A lower surface of the auxiliary groove 139 may also match the upper surface of the center plate 132. The protruding portion 141 is inserted in the concave portion 135, thereby aligning the first lens block 140. The auxiliary groove 139 may be formed by vertically cutting the other surface of the first guard portion 133. The cut surface may provide a third lateral surface 137 that may be aligned with the first and second lateral surfaces 147 and 167. The third lateral surface 137 may be used to have a plurality of wavelength division multiplexing and demultiplexing apparatuses provided adjacent to each other. In other words, two wavelength division multiplexing and demultiplexing apparatuses may be provided such that the third lateral surfaces 137 of the is wavelength division multiplexing and demultiplexing apparatuses can face each other.

An auxiliary body portion 138 may be combined with the second guard portion 134 and the center plate 132. The auxiliary body portion 138 may have a box shape with a bottom surface and one lateral surface opened. The auxiliary body portion 138 may provide a space for accommodating circuits arranged on a printed circuit board 120. Also, the auxiliary body portion 138 may include a through hole 233 at the other surface thereof. The through hole 233 may provide air circulation of the auxiliary body portion 138. The second guard portion 134 may be removed in an area where the auxiliary body portion 138 and the second guard portion 134 are combined with each other. Accordingly, the auxiliary body portion 138 and the second guard portion 134 may provide a device arrangement space 136. In other words, the second guard portion 134 combined with the auxiliary body portion 138 may provide the device arrangement space 136 in which photoelectric devices 124 and a photoelectric device driver circuit 126 for driving the photoelectric devices 124 may be provided.

A substrate 123 may include a first threshold 125 for aligning the photoelectric devices 124. The first threshold 125 may be variously modified into a rectangular shape or a strip shape as long as the first threshold 125 can align the photoelectric devices 124. The first threshold 125 may be formed by photolithography and etching processes in a process of manufacturing the substrate 123. The substrate 123 may be a GaAs substrate or a ceramic substrate having superior thermal conductivity. For example, first to fourth photoelectric devices 124 may be aligned to corner portions of the first threshold 125 protruding in a rectangular shape. Also, the substrate 123 may include a conductive pad (not shown), and the conductive pad may be wired to each of the photoelectric devices 124. The shape of the first threshold 125 may be variously modified as long as the first threshold 125 can align the photoelectric devices 124.

The photoelectric devices 124 may be provided on the substrate 123 and is fixed thereto by using an adhesive. The photoelectric devices 124 may include at least one of light receiving device and light emitting device. The light receiving devices may be photodiodes, whereas the light emitting devices may be laser diodes. In detail, the laser diodes may be vertical cavity surface emitting lasers (VCSELs).

The light emitting devices may be formed to emit light rays of different wavelengths. For example, when a GaAs quantum well is used as a light emitting material, a semiconductor laser having a wavelength of 850 nm may be obtained. Also, when Al is mixed with GaAs, a semiconductor laser having a wavelength of 700 nm-840 nm may be manufactured according to a mixture rate. When In is mixed with GaAs, a semiconductor laser having a wavelength of 870 nm-1100 nm may be obtained.

The light receiving devices may have wavelength selectivity. For example, the light receiving devices may be PIN photo diodes (PIN PDs) or avalanche photo diodes (APDs). The light receiving devices may have wavelength selectivity by using GaAs, InGaAs, or AlGaAs. In detail, when an InGaAs absorption layer grown on an InP substrate is used, the light receiving devices may have a responsibility in a range of 900 nm to 1600 nm. When a GaAs absorption layer grown on a GaAs substrate is used, the light receiving devices may have a responsibility in a range of 400 nm to 900 nm.

For example, the light emitting devices may operate in a range of 700 nm -840 nm by using an AlGaAs based material, whereas the light receiving devices may operate in a range of 900 nm-1600 nm by using an InGaAs based material. In this case, cross-talk between the light emitting devices and the light receiving devices is reduced. Accordingly, the thin film filters 150 may operate, even if performance thereof is degraded.

For example, the light emitting devices may operate in a range of 870 nm -1100 nm by using an InGaAs based material, whereas the light receiving devices may operate in a range of 400 nm-850 nm by using a GaAs based material. In this case, cross-talk between the light emitting devices and the light receiving devices is reduced. Accordingly, the thin film filters 150 may operate, even if performance thereof is degraded.

The substrate 123 may be provided on the printed circuit board 120. A conductive pad (not shown) of the printed circuit board 120 may be electrically connected to the conductive pad of the substrate 123 by wiring. The printed circuit board 120 may be a flexible substrate. An alignment line 121 may be patterned on the printed circuit board 120. The alignment line 121 may be used to align the printed circuit board 120 and the base 130.

An external connection electrode pad 122 is formed at one side of the printed circuit board 120. The external connection electrode pad 122 is connected to an external circuit by electric contact. The substrate 123, the photoelectric devices 124, and the photoelectric device driver circuit 126 may be provided on one surface of the printed circuit board 120.

The other surface of the printed circuit board 120 contacts the reinforcement plate 110. The reinforcement plate 110 may be formed of a material having high thermal conductivity and strength. In detail the reinforcement plate 110 may be formed of stainless steel. The size of the reinforcement plate 110 may be substantially the same as that of the printed circuit board 120. The reinforcement plate 110 and the other surface of the printed circuit board 120 may adhere to each other by an adhesive having a superior thermal conductivity. The adhesive may be epoxy resin.

A material having a thermal expansion coefficient that is similar to that of the base 130 may be selected for the reinforcement plate 110. Accordingly, even when the reinforcement plate 110 is heated to expand, the alignment of the photoelectric device 124 and the lens array 149 may be maintained. In detail, when the reinforcement plate 110 is formed of stainless steel, the base 130 may be formed of high strength plastic including glass. Accordingly, a thermal deformation restriction unit for restricting thermal expansion or contraction between the reinforcement plate 110 and the base 130 may be removed.

Figure 6:
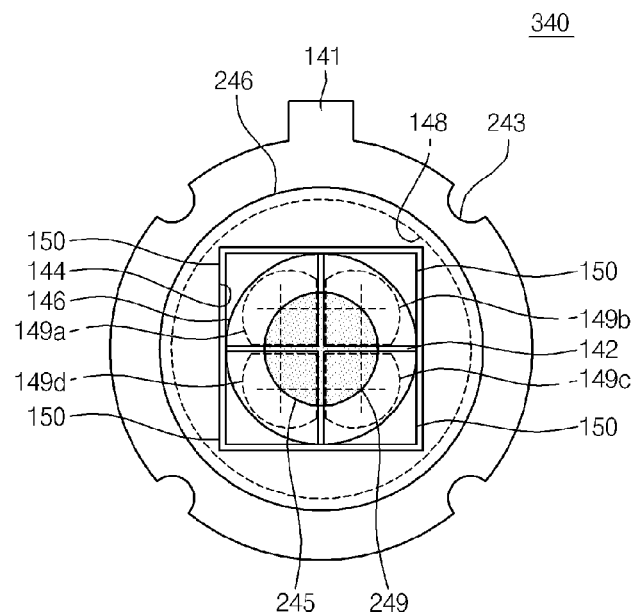
FIGS. 6 and 7 are plan views illustrating a first lens block according to other embodiments of the present invention.
Figure 7:
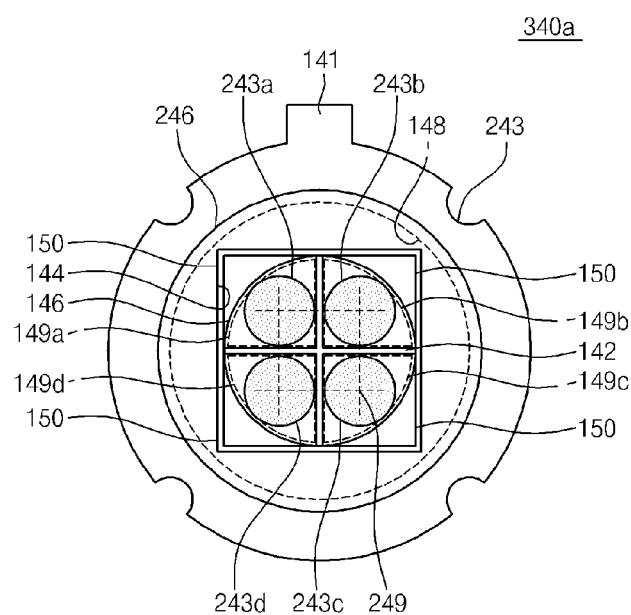

FIGS. 6 and 7 are plan views illustrating a first lens block according to other embodiments of the present invention. In the following description, the same descriptions as those presented with reference to FIGS. 1 to 6 are omitted is herein.

Referring to FIG. 6, a parallel light is incident upon a first lens block 340 through the second lens block 160. The first lens block 340 may have a shape similar to a disk. The lens array 149, that is, the first to fourth auxiliary lenses 149a-149d, may be arranged at a first surface of the first lens block 340. The hollow 148 having a predetermined depth to protect the lens array 149 may be arranged at one side of the first lens block 340. The hollow 148 may have a cylindrical shape with respect to a center axis of the first lens block 340. A bottom surface of the hollow 148 may form the first surface of the first lens block 340, and the lens array 149 may be formed on the first surface. The first lens block 340 may be formed of a transparent plastic or acryl material in one body.

The lens array 149 may be symmetrically arranged around the center axis of the first lens block 340. The lens array 149 may include the first to fourth auxiliary lenses 149a-149d. Each of the first to fourth auxiliary lenses 149a-149d may have a reference point 249. Each of the first to fourth auxiliary lenses 149a-149d may provide a light ray starting from a focus thereof as a parallel light or a parallel light incident upon each of the first to fourth auxiliary lenses 149a-149d to the focus thereof.

The first to fourth auxiliary lenses 149a-149d may have a shape in which four (4) circles are overlapped with one another and an overlapped area is cut along a straight line. The separation region 142 maybe arranged in a portion where the first to fourth auxiliary lenses 149a-149d are adjacent to one another. A light ray passing through the separation region 142 may not be provided to the photoelectric devices 124. Each of the first to fourth auxiliary lenses 149a-149d may be a spherical lens having a certain radius of curvature with respect to the reference point or an aspherical lens. The first to fourth auxiliary lenses 149a-149d may have the same focal length. Surfaces of the first to fourth auxiliary lenses 149a-149d may be non-reflection coated.

The lens array 149 may be variously modified as long as the lens array 149 is symmetrically arranged around the center axis of the first lens block 340.

The first lens block 340 may include, in the second surface thereof, the first concave 144 and the second concave 146 arranged inside the first concave is 144. The first concave 144 may have a rectangular shape formed with respect to the center axis of the first lens block 140. The center axis of the second concave 146 may match that of the first concave 144. The depth of the first concave 144 may be similar to the thickness of each of the thin film filters 150. The second concave 146 may be circular, and the depth of the second concave 146 may be greater than or equal to tens of micrometers. The depth of the second concave 146 may be sufficiently large such that the Fabry-Perot interferometer effect between the thin film filters 150 and the bottom surface of the second concave 146 can be diminished. The corners of the thin film filters 150 may have an area that is overlapped with the separation region 142.

The diameter of the first concave 144 may be greater than or equal to that of the second concave 146. The thin film filters 150 may be provided at the corner portions of the first concave 144. The thin film filters 150 may be bonded to the corner portions of the first concave 144 by using an adhesive. The diameter of the second concave 146 may be greater than or equal to that of the lens portion 166 of the second lens block 160.

Referring to FIG. 6, when the photoelectric devices 124 are light receiving devices, a light irradiation region 245 where a light ray is incident may have a circular shape having a center point of the first lens block 340. The light irradiation region 245 may be arranged in an inner area of the first to fourth auxiliary lenses 149a-149d.

Referring to FIG. 7, when the photoelectric devices 124 are light emitting devices, each of light irradiation regions 243a-243d where light rays irradiated by the photoelectric devices 124 are incident may have a circular shape having a center point 249 of each of the first to fourth auxiliary lenses 149a-149d. The light irradiation regions 243a-243d may be respectively arranged in the inner areas of the first to fourth auxiliary lenses 149a-149d.

The first to fourth auxiliary lenses 149a-149d may have a shape that is obtained by cutting a circle into four (4) parts. The separation region 142 may be arranged in adjacent portions of the first to fourth auxiliary lenses 149a-149d. A light ray passing through the separation region 142 may not be provided to the photoelectric devices 124.

According to a modified embodiment of the present invention, the lens array 149 may have a fan shape obtained by dividing a circle by n.

Figure 8:
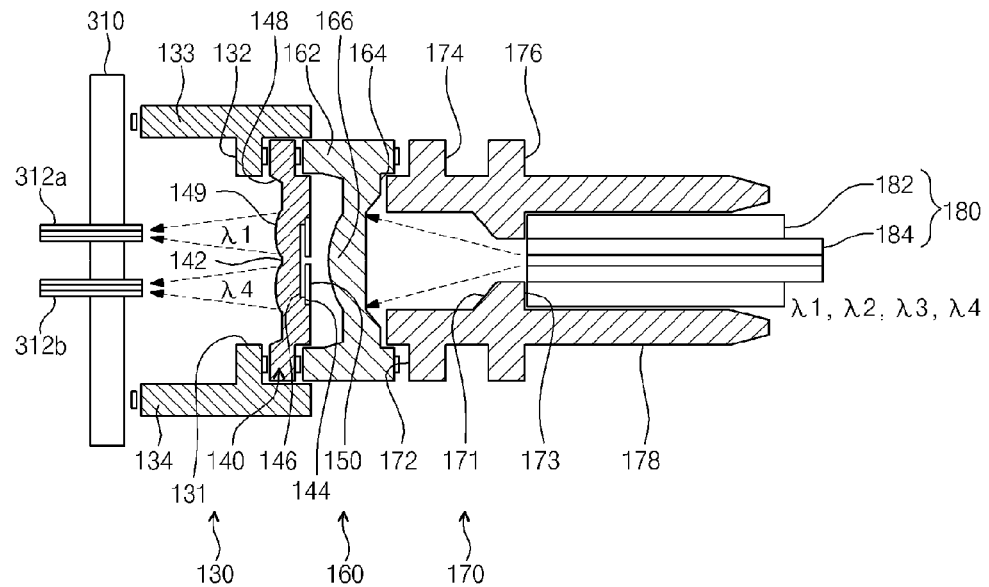
FIGS. 8 to 11 are views illustrating an optical communication module according to other embodiments of the present invention.

FIG. 8 is a view illustrating an optical communication module according to another embodiment of the present invention. In the following description, the same descriptions as those presented with reference to FIGS. 1 to 6 are omitted herein.

Referring to FIG. 8, an array of optical fibers 312a and 312b is provided instead of the photoelectric devices 124. Accordingly, light rays having a plurality of wavelengths are provided to the array of optical fibers 312a and 312b via the optical fiber ferrule 180, the second lens block 160, and the first lens block 140. The light rays of different wavelengths are provided to the optical fibers 312a and 312b by the thin film filters 150 and the lens array 149.

The light rays provided by the array of optical fibers 312a and 312b are provided to the optical fiber ferrule 180 via the first lens block 140 and the second lens block 160.

The array of optical fibers 312a and 312b may be provided on a support substrate 310 that is combined with the base 130. The support substrate 310 and the base 140 may be insertion combined with each other or may be combined with each other by using an adhesive.

Figure 9:
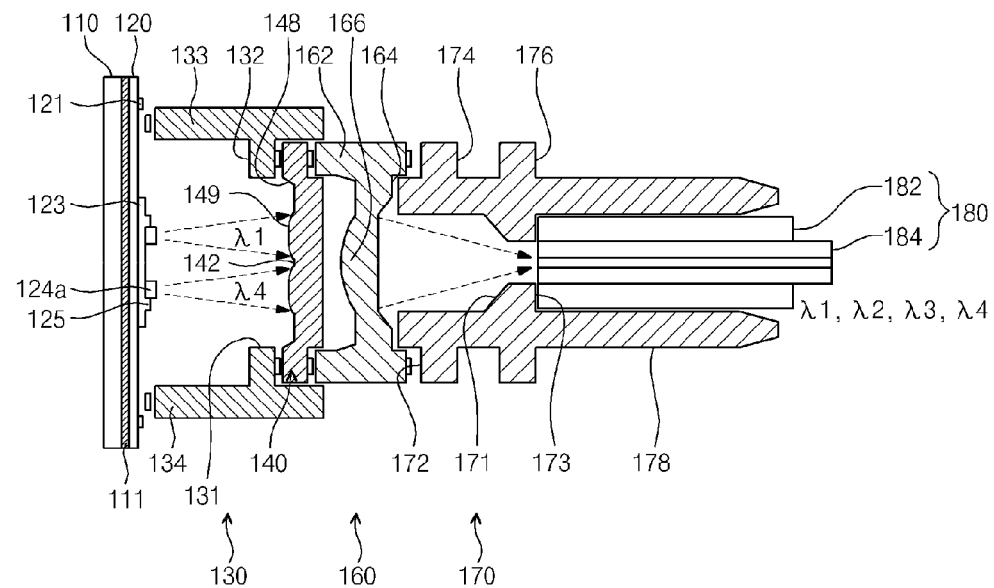

FIG. 9 is a view illustrating an optical communication module according to another embodiment of the present invention. In the following description, the same descriptions as those presented with reference to FIGS. 1 to 6 are omitted herein.

Referring to FIG. 9, the lens array 149 is arranged at one side of the first lens block 140, whereas the thin film filters 150 may not be arranged at the other side thereof. In other words, a concave is not formed at the other side of the first lens block 140. In this case, photoelectric devices 124a are formed with light emitting devices only and the photoelectric devices 124a may have different wavelengths from each other. Accordingly, the thin film filters 150 may be unnecessary.

Figure 10:
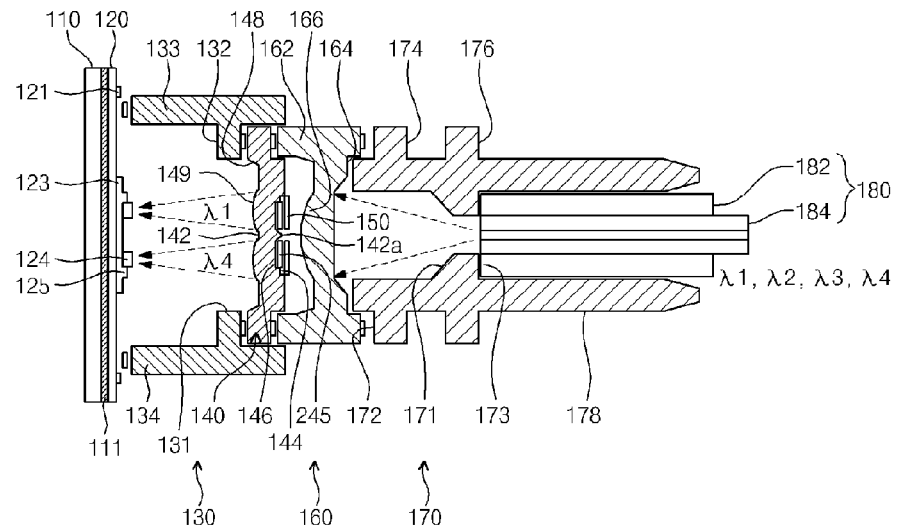

FIG. 10 is a view illustrating an optical communication module according is to another embodiment of the present invention. In the following description, the same descriptions as those presented with reference to FIGS. 1 to 6 are omitted herein.

Referring to FIG. 10, the lens array 149 is arranged at one side of the first lens block 140, whereas the first concave 144 may be arranged at the other side thereof. The thin film filters 150 may be arranged in the first concave 144. A refractive index matching material 245 may be provided between the thin film filters 150 and the lower surface of the first concave 144. A refractive index n1 of the refractive index matching material 245 may be between a refractive index n2 of the thin film filters 150 and a refractive index n3 of the first lens block 140. The refractive index n1 of the refractive index matching material 245 may be provided as a square root of the product of n2 and n3. Accordingly, the Fabry-Perot interferometer effect that is parasitically generated may be reduced.

A separation region 142a may be arranged at the other side of the first lens block 140. The separation region 142a may be arranged between the thin film filters 150. Alternatively, the separation region 142a may be arranged on a boundary surface between the first to fourth auxiliary lenses 149a-149d of the lens array 140. A light ray incident on the separation region 142a may not be provided to the lens array 149 or may not be concentrated on the focus of the lens array 149. The separation region 142a may have a protruding triangular column shape, but the present invention is not limited thereto. The separation region 142a may be variously modified only when the separation region 142a has a radius of curvature or an angle different from other surrounding areas.

Figure 11:
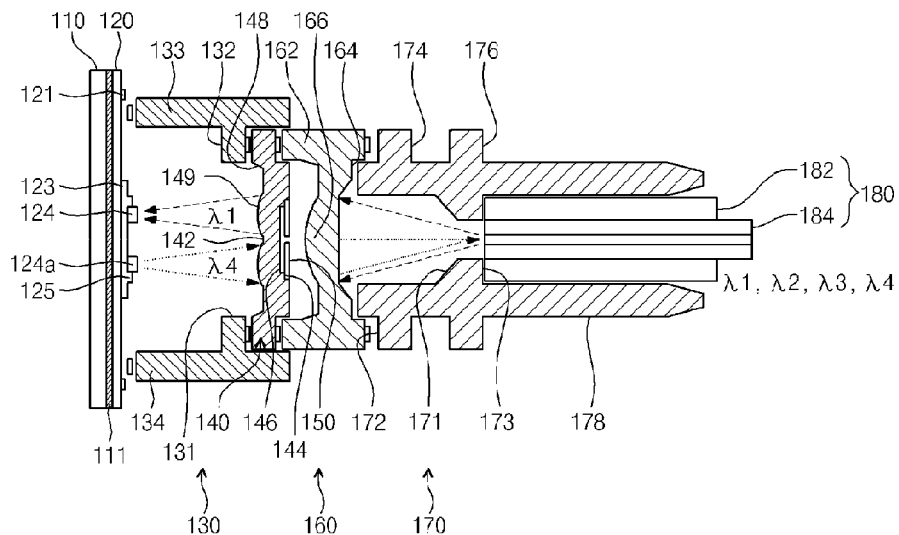

FIG. 11 is a view illustrating an optical communication module according to another embodiment of the present invention. In the following description, the same descriptions as those presented with reference to FIGS. 1 to 6 are omitted herein.

Referring to FIG. 11, the photoelectric devices 124 and 124a may include at least one light emitting device 124a and at least one light receiving device 124. A wavelength of a light ray emitted by the light emitting device 124a and a wavelength of a reaction range of the light receiving device 124 may be different from each other.

Figure 12:
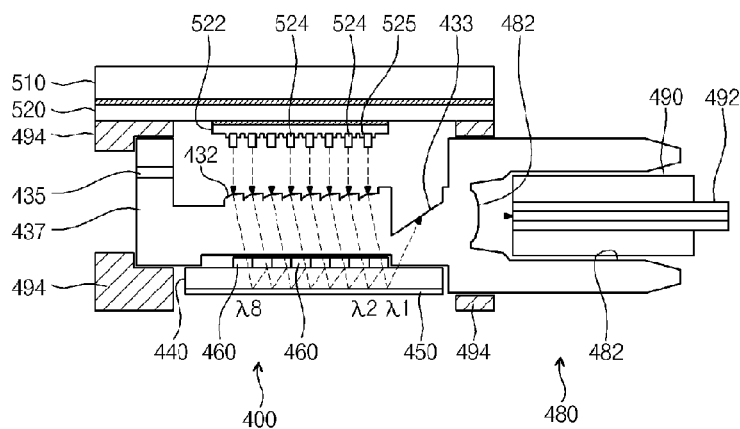
FIG. 12 is a cross-sectional view illustrating an optical apparatus according to another embodiment of the present invention.
Figure 13:
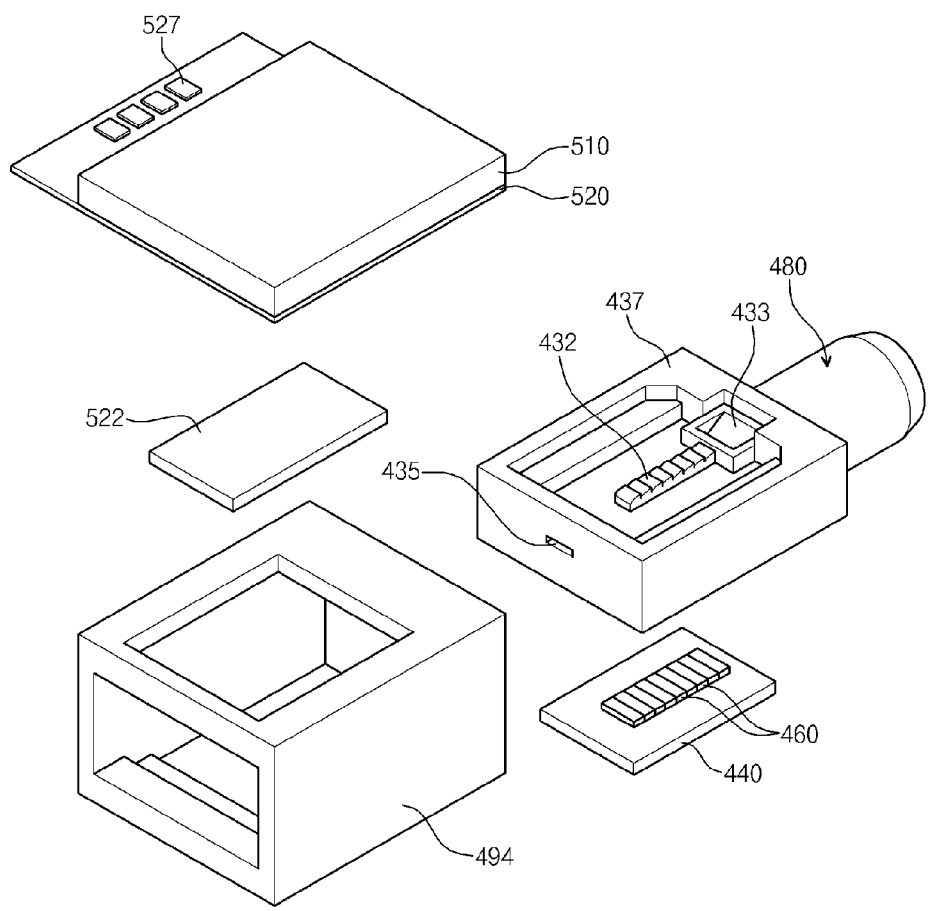
FIG. 13 is an exploded perspective view of the optical apparatus of FIG. 12.

FIG. 12 is a cross-sectional view illustrating an optical apparatus according to another embodiment of the present invention. FIG. 13 is an exploded perspective view of the optical apparatus of FIG. 12.

Referring to FIGS. 12 and 13, the optical apparatus according to the present embodiment includes a reinforcement plate 510 formed of a stainless steel material, photoelectric devices 524 arranged on the reinforcement plate 510, and a multiplexing and demultiplexing unit 400 arranged on the photoelectric devices 524. The multiplexing and demultiplexing unit 400 that directly or indirectly contacts the reinforcement plate 510 is formed of high strength plastic including glass.

The optical apparatus further includes a flexible printed circuit board 520 interposed between the reinforcement plate 510 and the photoelectric devices 524, and a substrate 522 interposed between the flexible printed circuit board 520 and the photoelectric devices 524. The reinforcement plate 510 and the flexible printed circuit board 520 are bonded to each other by using an adhesive. The flexible printed circuit board 520 and the substrate 522 are bonded to each other by using an adhesive. The adhesive may be epoxy-based resin.

The substrate 522 may be formed of ceramic or GaAs. An alignment mark 525 may be patterned on a surface of the substrate 522. Accordingly, the photoelectric devices 524 may be easily aligned. The photoelectric devices 524 may include at least one of a light emitting device and a light receiving device.

The multiplexing and demultiplexing unit 400 includes an optical block 440 having a lower surface and a upper surface, which are flat, a reflection coating 450 provided on the lower surface of the optical block 440, a plurality of optical filters 460 arranged to be separated from one another according to a wavelength and provided on the upper surface of the optical block 440, an optical coupling block 480 having a lower surface arranged corresponding to the upper surface of the optical block 440, including a plurality of aspherical lenses 432 formed on an upper surface arranged opposite to the lower surface, and including a body portion 437 surrounding the aspherical lenses 432, a is receptacle 490 for accommodating an end of an optical fiber 492, a focusing lens 482 arranged to be aligned to the receptacle 490, a beam reflection portion 433 arranged between the focusing lens 482 and the lower surface of the optical coupling block 480 and providing an optical path between the focusing lens 482 and the upper surface of the optical block 440, and a bonding block 494 combined with at least the upper surface of the body portion 437.

The body portion 437 may include a through hole 435. The through hole 435 may provide flow of air between an area where the aspherical lens is arranged and an external area. The body portion 437 may be inserted in the bonding block 494 and coupled thereto by using an adhesive. The bonding block 494 may be combined with the flexible printed circuit board 520 by using an adhesive. The bonding block 494 may be high strength plastic including glass. A thermal expansion coefficient of the bonding block 494 may substantially match that of the reinforcement plate 510.

The bonding block 494 may have a box shape. The bonding block 494 may be variously modified as long as a portion contacting the flexible printed circuit board 520 is high strength plastic.

Referring back to FIGS. 1 to 6, the apparatus 10 for wavelength-division multiplexing and demultiplexing may include the first lens block 140 having the lens array 149 at one side thereof, the second lens block 160 including a lens surface corresponding to the lens array 149 and combined with the other side of the first lens block 140, the receptacle 170 having the optical fiber ferrule 180 fixed at a center thereof and stacked on the second lens block 160, and the base 130 combined with one side of the first lens block 140.

The multiplexing and demultiplexing unit may be substituted with a variety of optical parts. For example, the optical part may be a lens, a fiber, a directive coupler, a diffractive lattice, etc.

The apparatuses for wavelength division multiplexing and demultiplexing according to the above-described various embodiments may transmit or receive optical signals of various wavelengths, that is, optical signals of multiple channels, through a single optical fiber. The optical communication module according to the various embodiments of the present invention may simplify a system structure when applied to signal transmission of digital video interactive (DVI), high definition multimedia interface (HDMI), or a display port which requires use of many channels. Also, when a light emitting device and a light receiving device are mixedly arranged, bidirectional transmission is possible, and thus the optical communication module may be functionally extended to be able to transmit signals through various methods such as direct digital control (DDC), RS232, audio, USB, display port, etc. To transmit signals in the various types of methods, for example, 2, 3, 4, 5, and 6 channels are available and the number of channels through which signals are transmitted and received may be adjusted according to a combination of the photoelectric devices.

To transmit signals of many channels through a single optical fiber, many light emitting devices for emitting light rays of different wavelengths are needed. Thus, when a plurality of light emitting devices are applied to the optical communication module for an optical wavelength division multiplexing according to the present invention, the light emitting devices may be formed to be able to emit light rays of different wavelengths.

In the field of DVI/HDMI, a four (4) channel method is normally and widely adopted, whereas a six (6) channel method with a bidirectional channel may be adopted to process various additional signals such as direct digital control (DDC), RS232, audio, USB, display port, etc. When the number of photoelectric devices provided on the substrate 123 is designed to fit to the number of channels that are needed, the optical communication module according to the present invention may be applied to a variety of fields needing multichannel, such as DVI/HDMI, direct digital control (DDC), RS232, audio, USB, display port, etc.

The invention claimed is:

1. An apparatus for wavelength division multiplexing and demultiplexing, the apparatus comprising:
 a first lens block including a lens array at one side of the first lens block;
 a second lens block including a lens surface corresponding to the lens array and facing another side of the first lens block;
 a receptacle having an optical fiber ferrule fixed at a center thereof and stacked on the second lens block; and
 a base combined with the one side of the first lens block, wherein the first lens block is stacked on the base.

2. The apparatus of claim 1, further comprising a plurality of thin film filters arranged at the another side of the first lens block corresponding to the lens array and having different wavelength ranges.

3. The apparatus of claim 2, wherein the optical fiber ferrule is aligned to a focal length of the second lens block, a light ray emitted from the optical fiber ferrule is converted to a parallel light by the second lens block, the parallel light is converted to light rays having predetermined wavelength ranges by the thin film filters, and the light rays having predetermined wavelength ranges are concentrated on focuses by the lens array.

4. The apparatus of claim 1, wherein the first lens block and the second lens block are insertion combined with each other, and the second lens block and the receptacle are insertion combined with each other.

5. The apparatus of claim 1, further comprising a substrate on which photoelectric devices are provided,
 wherein the substrate comprises an alignment mark for aligning the photoelectric devices, and the base aligns the photoelectric devices at a focal length of the lens array.

6. The apparatus of claim 5, further comprising:
 a printed circuit board on which the substrate is provided; and
 a reinforcement plate on which the printed circuit board is provided.

7. The apparatus of claim 6, wherein the reinforcement plate is formed of a metal material, the base is formed of high strength plastic including glass, the base has a thermal expansion coefficient that is substantially the same as a thermal expansion coefficient of the reinforcement plate, the printed circuit board and the reinforcement plate are bonded by using an adhesive, and the printed circuit board and the base are bonded by using an adhesive.

8. The apparatus of claim 6, wherein the printed circuit board is a flexible printed circuit board, and a photoelectric device driver circuit is provided on the printed circuit board.

9. The apparatus of claim 1, comprising:
 a first concave formed at the another side of the first lens block; and
 a second concave formed in the first concave,
 wherein the first concave has a rectangular shape and the second concave has a circular shape.

10. The apparatus of claim 7, further comprising a plurality of thin film filters that are fixed to corners of the first concave.

11. The apparatus of claim 1, further comprising:
 a first concave formed at the another side of the first lens block and having a rectangular shape; and
 a plurality of thin film filters provided on the first concave,
 wherein a refractive index matching material is provided between the plurality of thin film filters and the first lens block.

12. The apparatus of claim 1, wherein the base comprises:
 a center plate having a through hole at a center thereof;
 a first guard portion having a cylindrical shape, having a diameter greater than a diameter of the through hole, and arranged at one surface of the center plate; and
 a second guard portion having a cylindrical shape, having a diameter greater than the diameter of the through hole, and arranged at another surface of the center plate,
 wherein the first lens block and the second lens block are sequentially stacked on the first guard portion and inserted in the first guard portion.

13. The apparatus of claim 12, wherein the first guard portion further comprises a groove portion collapsed to the center plate, the first lens block further comprises a protruding portion, and the protruding portion is inserted in the groove portion to be aligned to the groove portion.

14. The apparatus of claim 1, wherein the lens array is symmetrically arranged around a center axis of the first lens block.

15. The apparatus of claim 1, wherein a separation region that does not concentrate light on a focus of each of auxiliary lenses of the lens array is formed at the another side of the first lens block.

16. An optical communication module comprising:
a first lens block including a hollow and a lens array arranged inside the hollow, wherein the hollow is for protecting the lens array arranged at one side of the first lens block;
a second lens block including a lens surface corresponding to the lens array and facing another side of the first lens block; and
a base combined with the one side of the first lens block, wherein the first lens block is arranged on the base.

17. An optical communication module comprising:
a first lens block including a lens array formed at one side of the first lens block and a plurality of thin film filters formed at another side of the first lens block, the plurality of thin film filters having different transmission regions corresponding to a lens array;
a second lens block including a lens surface corresponding to the lens array and facing the another side of the first lens block;
a base combined with the one side of the first lens block; and
a plurality of optical fibers arranged at a focal length of the lens array,
wherein the base and the first lens block are insertion combined with each other.

18. An optical apparatus comprising:
a reinforcement plate formed of a metal material;
a plurality of photoelectric devices arranged on the reinforcement plate;
a multiplexing and demultiplexing unit arranged on the plurality of photoelectric devices,
wherein the multiplexing and demultiplexing unit directly or indirectly contacts the reinforcement plate;
a flexible printed circuit board provided between the reinforcement plate and the plurality of photoelectric devices; and
a substrate provided between the flexible printed circuit board and the plurality of photoelectric devices,
wherein the reinforcement plate and the flexible printed circuit board are fixed to each other by using an adhesive, and the flexible printed circuit board and the substrate are fixed to each other by using an adhesive.

19. An optical apparatus comprising:
a reinforcement plate formed of a metal material;
a plurality of photoelectric devices arranged on the reinforcement plate;
a multiplexing and demultiplexing unit arranged on the plurality of photoelectric devices,
wherein the multiplexing and demultiplexing unit directly or indirectly contacts the reinforcement plate,
wherein the multiplexing and demultiplexing unit comprises:
a first lens block including a lens array formed at one side of the first lens block;
a second lens block including a lens surface corresponding to the lens array and combined with another side of the first lens block;
a receptacle having an optical fiber ferrule fixed to a center thereof and stacked on the second lens block; and
a base combined with the one side of the first lens block.

20. An optical apparatus comprising:
a reinforcement plate formed of a metal material;
a plurality of photoelectric devices arranged on the reinforcement plate;
a multiplexing and demultiplexing unit arranged on the plurality of photoelectric devices.
wherein the multiplexing and demultiplexing unit directly or indirectly contacts the reinforcement plate,
wherein the multiplexing and demultiplexing unit comprises:
an optical block having a lower surface and an upper surface, which are flat;
a reflection coating formed on the lower surface of the optical block;
a plurality of optical filters arranged separated from each other according to their respective wavelengths and provided on the upper surface of the optical block;
an optical coupling block having a lower surface arranged corresponding to the upper surface of the optical block, including a plurality of aspherical lenses formed on the upper surface of the optical coupling block opposite to the lower surface of the optical coupling block, and having a body portion surrounding the plurality of aspherical lenses;
a receptacle for accommodating one end of an optical fiber;
a focusing lens aligned to the receptacle;
a beam reflection portion arranged between the focusing lens and the lower surface of the optical coupling block and providing an optical path between the focusing lens and the upper surface of the optical block; and
an adhesive block combined with at least an upper surface of the body portion.

* * * * *